United States Patent [19]
Miller

[11] 3,982,916
[45] Sept. 28, 1976

[54] METHOD FOR FORMING OPTICAL FIBER PREFORM

[75] Inventor: Stewart Edward Miller, Locust, N.J.

[73] Assignee: Bell Telephone Laboratories, Incorporated, Murray Hill, N.J.

[22] Filed: Dec. 24, 1975

[21] Appl. No.: 644,136

[52] U.S. Cl. .................................. 65/3 A; 65/18; 65/30 R; 65/60 D; 65/DIG. 7; 350/96 WG; 427/116
[51] Int. Cl.² ..................... C03B 23/04; C03B 37/02
[58] Field of Search .................. 65/2, 3 A, 4 B, 13, 65/18, 30 R, DIG. 7, 60 D; 350/96 WG; 427/116

[56] References Cited
UNITED STATES PATENTS

| 3,666,348 | 5/1972 | Marcatili | 350/96 WG |
| 3,687,514 | 8/1972 | Miller | 350/96 WG |
| 3,711,262 | 1/1973 | Keck et al. | 65/3 A |
| 3,737,292 | 6/1973 | Keck et al. | 65/3 A |
| 3,737,293 | 6/1973 | Maurer | 65/3 A |
| 3,932,160 | 1/1976 | Camlibel | 65/18 X |

*Primary Examiner*—Robert L. Lindsay, Jr.
*Attorney, Agent, or Firm*—Bryan W. Sheffield

[57] ABSTRACT

A process for manufacturing preforms from which clad optical fibers having longitudinal, eccentric, azimuthal index inhomogeneities may be drawn. In one embodiment, the known CVD process for making preforms is modified by the use of asymmetric heating to produce circumferentially alternating deposits of doped and undoped glass which act as the fiber core when the preform is subsequently collapsed and drawn into a fiber.

12 Claims, 15 Drawing Figures

METHOD FOR FORMING OPTICAL FIBER PREFORM

BACKGROUND OF THE INVENTION

A. Field of the Invention

Broadly speaking, this invention relates to optical fibers. More particularly, in a preferred embodiment, this invention relates to methods and apparatus for manufacturing an optical fiber having azimuthal index inhomogeneities.

B. Discussion of the Prior Art

The advantages of deliberately enhancing mode conversion in a multi-mode optical fiber have been widely reported in the literature. Typically, this enhancement is achieved by randomly modulating the cross-sectional dimensions and axial orientation of the guide. See, for example, U.S. Pat. Nos. 3,687,514 and 3,666,348 which respectively issued Aug. 29, 1972 to S. E. Miller et al. and on May 30, 1972 to E. A. J. Marcatili. Both of these commonly assigned patents are hereby incorporated by reference into this specification.

Recent analytical studies by D. Marcuse have suggested the desirability of introducing azimuthal index variations into the guide to mix modes of different azimuthal order. These studies further suggest that any resultant radial index inhomogeneities (which mix radial orders) be confined to a region which is close to the axis of the core. However, heretofore it has not been possible to implement either of Marcuse's proposals.

There are, of course, several different techniques which may be used to manufacture a clad optical fiber, including the so-called chemical vapor depositiion (CVD) process disclosed in U.S. Pat. Nos. 3,711,262 — 3,737,292 and 3,737,293. Of particular interest is the commonly assigned, copending application, Mac-Chesney-O'Connor, Ser. No. 444,705, filed Feb. 22, 1974, which application is hereby incorporated by reference. As disclosed in the MacChesney-O'Connor application, a constantly moving stream of gas-phase precursor reactants and oxygen is flowed through a hollow tubular glass preform. The preform and its contents are then heated to a homogeneous reaction temperature within a moving hot zone produced by a moving heat source which constantly traverses the outside of the tube. Homogeneously produced glass particles, loosely called "soot," collect on the walls of the tube and are fused into a continuous layer within the hot zone. The preform is then collapsed and drawn into a fiber in the normal manner. This process differs from the prior art because in prior art processes a simultaneous heterogenous reaction occurs which produces a glassy layer within the moving hot zone by means of a reaction which occurs at the heated wall surface.

SUMMARY OF THE INVENTION

The problem, then, is to modify the above-described CVD processes to yield a fiber having an azimuthal index variation. This problem has fortunately been solved by the instant invention which, in a preferred embodiment, comprises an improvement to a known method of manufacturing a preform which is intended to be subsequently drawn into an optical fiber. The known method includes the steps of flowing a vapor mixture including at least one compound, glass-forming, precursor together with an oxidizing medium through a hollow, cylindrical substrate and heating the substrate and contained vapor mixture with a moving heat source, external to the substrate, such that a suspension of particulate, oxidic reaction product material is produced within the substrate, the particulate material traveling downstream and coming to rest on the inner surface of the substrate and thereat being fused to form a continuous glassy deposit on the inner surface of the substrate. The improvement which constitutes this invention comprises the steps of adding a dopant to the glass-forming precursor thereby to alter the refractive index of the particulate material, asymmetrically heating the substrate to preferentially deposit the doped particulate material as a continuous glassy deposit on at least one first region of the inner surface, removing the dopant from the glass-forming precursor, inverting the asymmetry of the asymmetrical heating to preferentially deposit the undoped particulate material as a continuous glassy deposit on at least one second region of the inner surface, the second region being substantially diametrically opposed from the first region, and then terminating the process when the glassy deposit has attained a predetermined thickness.

The invention and its mode of operation will be more fully understood from the following detailed description, when taken with the appended drawings, in which:

DETAILED DESCRIPTION OF THE INVENTION

Figure 1:
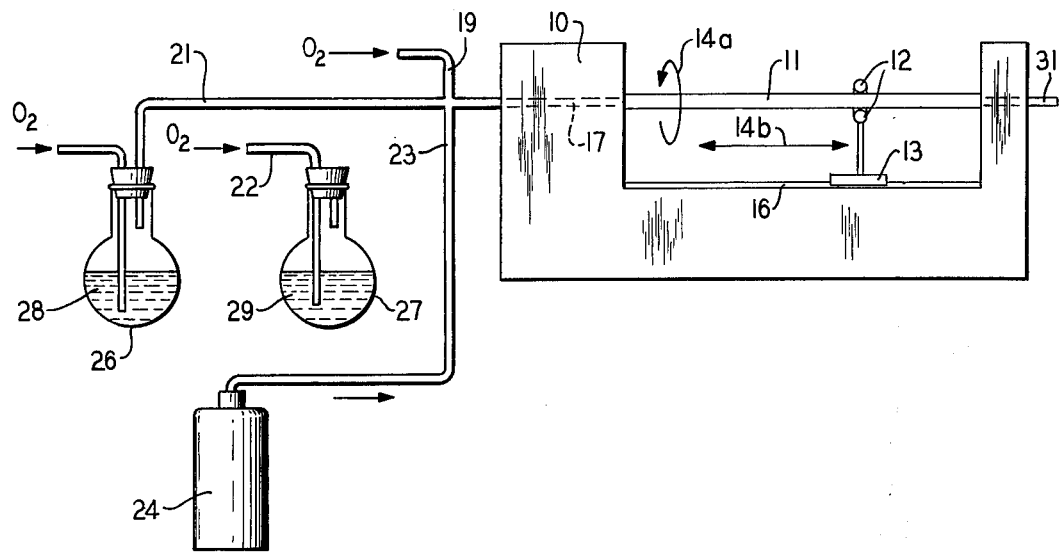
FIG. 1 is a front view of an illustrative chemical vapor deposition apparatus for manufacturing optical fiber according to the invention.

FIG. 1 depicts a lathe 10 holding a hollow glass preform 11 within which a hot zone 12 is produced by some suitable heating means 13. Advantageously, preform 11 is rotated, for example, in the direction shown by arrow 14a, by means not shown and hot zone 12 caused to traverse preform 11 by movement of heating means 13 as schematically depicted by double-headed arrow 14a, for example, by a threaded feed member 16. A gaseous material is introduced into preform 11 via inlet tube 17 which is, in turn, connected to source material reservoirs 18. Such reservoirs may include an exygen inlet 19 connected to means not shown. As depicted, gaseous material may also be introduced by inlets 21 and 22 by means not shown and through inlet 23 from reservoir 24. Reservoirs 26 and 27 each contain a normally liquid reactant material which is introduced into preform 11 by means of carrier gas introduced through inlets 21 and 22 such that the carrier gas is bubbled through liquid reactant material 28 and 29. Exiting material is exhausted through an outlet 31. Not shown is the arrangement of mixing valves and shut-off valves which may be utilized to meter flows and to make other necessary adjustments in composition. The apparatus of FIG. 1 is generally horizontally disposed, however, one skilled in the art will appreciate that the apparatus could be vertically disposed with only minor modification. Vertical disposition of the substrate tube, however, lends stability to the portion of the tube within the hot zone and may permit attainment of higher temperature or of longer hot zones in the traversal direction without objectionable distortion.

Figure 2:
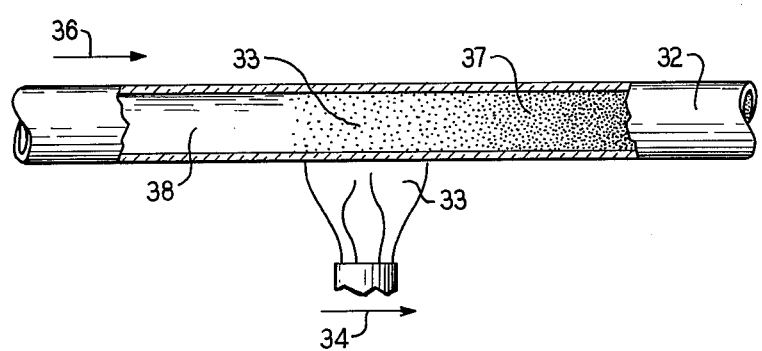
FIG. 2 is a partial cross-sectional view of the preform shown in FIG. 1 and depicts the nature of the deposition process.

FIG. 2 is a front elevational view of a section of a preform 32 as observed during deposition. Depicted in FIG. 2 is a heating means 33 producing a hot zone 34 which is traversing preform 32 in the direction shown by arrow 36 by means not shown. Gaseous material is introduced at the left end of preform 32 and flows in the broken section of the figure in the direction shown by arrow 37. Two regions are clearly observable during deposition. Zone 38, downstream of hot zone 34, is filled with a moving, powdery, suspension of particulate oxidic material, while region 39, devoid of such particulate matter, defines the region within which fusion of the deposited material is occurring. For a more detailed description of the modified CVD process and specific example of temperatures, dopant materials, etc. the reader is referred to the above-referenced, co-pending application of MacChesney and O'Connor. Suffice it to say here that the reactant materials may include chlorides and hydrides, as well as other compounds which will react with oxygen. As in other vapor reaction processes, other gaseous material may be introduced, for example, to act as carrier or, in the instance of extremely combustible reactant matter such as hydrides, to act as a diluent.

Continuous fusion within the hot zone and the resultant thickness uniformity of the deposit facilitates formation of graded index structures. As in conventional CVD processes, gradients may be produced by varying the reactant composition with the ratio of high index-producing dopants increasing, in this instance, with successive hot zone traversals. Since the reaction conditions for different constituents in the reactant mix are different, it is also possible to produce an index gradient by altering the temperature and/or the flow rate during processing.

Typical reaction temperatures maintained at least at the tube wall are within the range of from 1200° to 1600 C. These temperatures, high relative to conventional CVD processes, are responsible for the rapidity of the preform production. Particularly at the high temperature end of the range, distortion of the unsually silica preform is avoided by rotation. Narrow zones, increased rotation speed, and vertical disposition of the tube may all contribute to the avoidance of tube distortion.

Figure 3A:
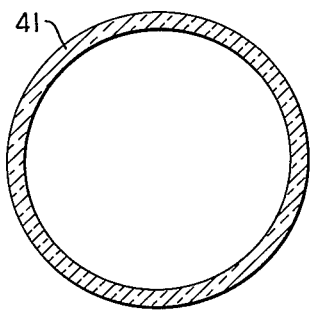
FIGS. 3A–3C are cross-sectional views of the preform shown in FIG. 2 at various stages of the chemical vapor deposition process.

Preforms adequate for the preparation of one or several kilometers of fiber may be prepared during deposition periods of only a few hours. These preforms are prepared by conventional processing from the deposited product to a final configuration which, as presently practiced, may be of rod shape with an internal diameter of from 4 to 8 mm and a length of 18 inches. Normally, the tube which serves as the deposition substrate becomes the cladding layer. It may be composed of pure silica or of silica which has been doped to alter, generally to reduce, its index. Variations of the process may include removal of the tube, as well as deposition of additional material on the outer surface. The tube serving as the substrate during deposition may be retained to serve as a cladding layer or it may be removed, or it may, during simultaneous deposition, be provided on its outer surface with encompassing layers, e.g., for protection purposes. Still considering the prior art process, FIG. 3A depicts a cross-sectional view of a hollow glass preform 41 before any deposits have been built-up thereon. At this stage, the preform is more properly referred to as a substrate. Typically, substrate 41 is comprised of ordinary silica, generally undoped.

Figure 3B:
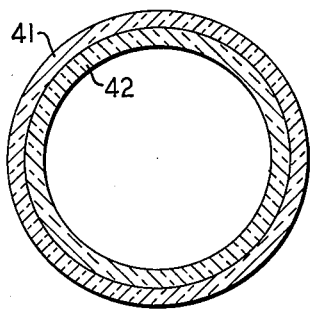

As shown in FIG. 3B, when the substrate is of ordinary purity, the first reactant which is introduced results in the formation of a first layer 42 of undoped silica or a silica which is doped with an oxide, such as $B_2O_3$, which serves to lower the refractive index. Of course, layer 42 also acts as a part of the cladding and presents a barrier to the diffusion of impurities from the tube. As previously mentioned, it may be considered that under these circumstances, the substrate tube ultimately serves as a mechanical support rather than as an optical cladding layer.

Figure 3C:
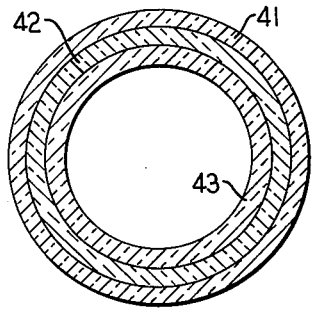

Subsequent to formation of this first barrier layer 42 or absent such procedure, where the tube is of sufficient purity, reactant materials of such nature as to result in the desired index-increased core are introduced into the vapors flowing through the tube. In a chloride system, for example, these reactant materials may take the form of a mixture of $SiCl_4$ together with, for example $GeCl_4$, and oxygen. Chlorides of other index-increasing materials, such as phosphorus, titanium, and aluminum may be substituted for $GeCl_4$ or admixed. $BCl_3$ may also be included perhaps to facilitate glass formation because of lowered fusion temperature; or because of refractive index lowering, the initial mixture may be altered during successive hot zone traversals so as to increase the index (by increasing $GeCl_4$ or other index-increasing dopant precursor or by decreasing $BCl_3$). As shown in FIG. 3C, these reactant materials build up a core layer 43 of increased index.

Since the usual vapor-phase glass precursor compounds are not oxidic, oxygen or a suitable oxygen-bearing compound is generally included in the mixture to form the ultimate oxidic glass. A satisfactory procedure, followed in an actual experiment, takes the form of an oxygen stream which is bubbled through reservoirs of liquid-phase, glass-forming compounds. In one procedure, for example, oxygen streams were bubbled through silicon tetrachloride and through germanium tetrachloride. These streams were then combined with vapor-phase boron trichloride and additional oxygen, the resultant mixture being introduced into the reaction chamber.

The relative amounts of glass-forming ingredients are dependent upon a variety of factors, such as vapor pressure, temperature, flow rate, desired index, etc. A variety of diluent materials may be utilized for any of the previously discussed reasons, so, for example, argon, nitrogen, helium, etc., may be used to maintain desired flow rates to prevent precombustion, etc. Oxygen-bearing compounds which may replace oxygen in whole, or in part, include $N_2O$, $NO$, and $CO_2$.

In general, concentration of 3d-transition metal impurities in the gas stream is kept below $10^{-2}$ percent, although further reduction in loss accompanies reduction of those impurities down to the part per billion range. Such levels are readily available from commercial sources or by purification by means similar to those taught by H. C. Theuerer in U.S. Pat. No. 3,071,444. As compared with the usual soot process, the procedure described in the copending MacChesney-O'Connor application is carried out in a controlled environment without direct exposure to combustion products. This inherently results in avoidance of the inclusion of particulate combustion products. Where desired, hydration resulting from combustion in the soot process may be minimized. This is a particularly significant advantage for operation in several portions of the infrared spectrum which suffers from sub-harmonics of the fundamental $H_2O$ absorption. Water vapor may, therefore, be particularly significant impurity and is kept to a level below a few ppm by volume.

The above-described process yields a preform having a uniform azimuthal gradient distribution. Let us now consider how an azimuthal index inhomogeneity can be produced.

Figure 4:
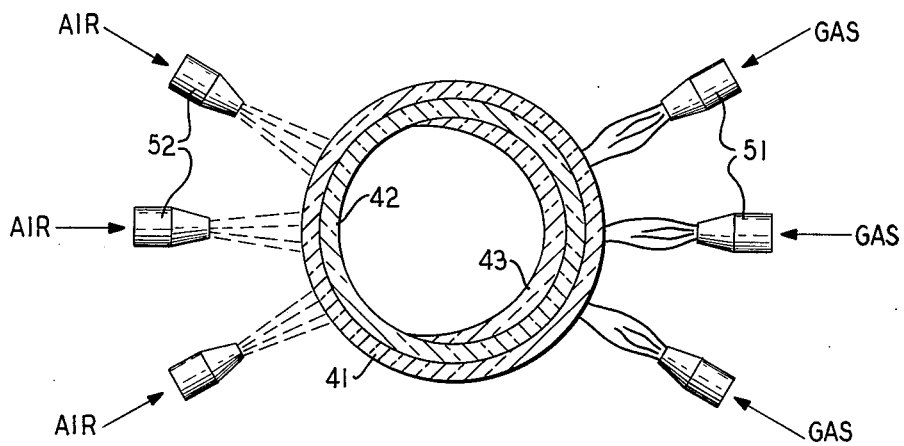
FIG. 4 is a partial cross-sectional view of an illustrative embodiment of the invention for asymmetrically heating the preform shown in FIG. 2.

As shown in FIG. 4 and according to the principles of this invention, the heating of substrate 41 is deliberately made asymmetrical, for example, by employing a plurality of oxy-hydrogen gas jets 51 on one side of the substrate and a plurality of cooling jets 52 on the other side of the substrate. Cooling jets 52 are supplied with air or an inert gas such as nitrogen. The combination of oxy-hydrogen gas jets on one side of the substrate and cooling jets on the other side results in the preferential build-up of a doped glassy layer 43 on one side of the tube.

Figure 5:
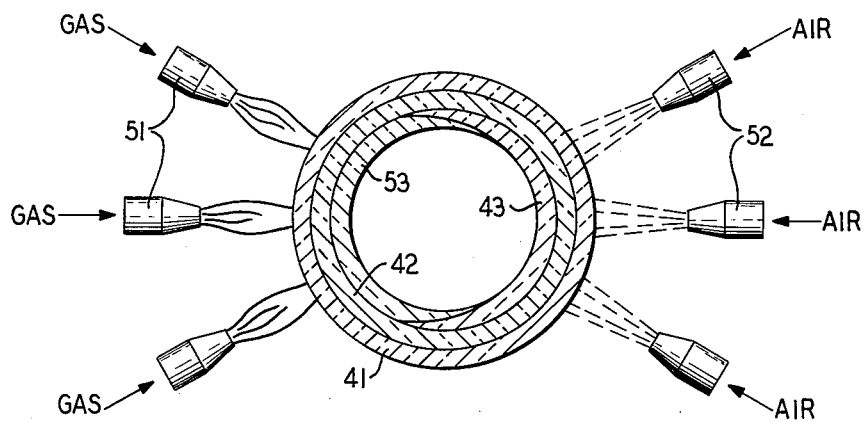
FIG. 5 is another view of the preform shown in FIG. 4 depicting how the heating asymmetry may be inverted during processing.

Next, as shown in FIG. 5, the gas jets and cooling jets are interchanged, or the substrate rotated through 180° and the process resumed; however, the dopants are now removed from the vapor flowing through the hollow cylindrical substrate. Accordingly, a layer 53 of undoped, pure $SiO_2$ will be preferentially built up on the opposite side of the substrate and when the doped and undoped layers are fused into glass a continuous core layer is formed, one-half of which is doped and one-half of which is undoped. When this preform is later collapsed and drawn into a fiber and fiber will exhibit the desired longitudinal, eccentric, index inhomogeneity. Of course, the invention is not limited to the use of oxy-hydrogen gas jets; other heat sources may be employed, for example, a $CO_2$ laser.

In the modified CVD process described in the previously referred to, co-pending application of MacChesney-O'Connor, the substrate is advantageously rotated during the deposition process to minimize deformation of the substrate. If this rotation is desired in the process discussed with reference to FIGS. 4 and 5, it will be evident that both the cooling and the heating jets must be rotated along with the substrate.

Figure 6:
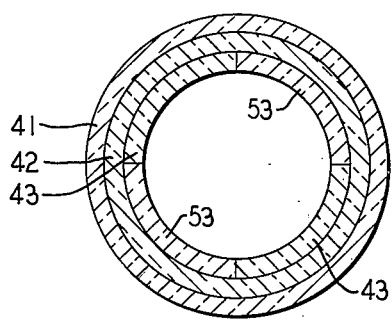
FIG. 6 is a cross-sectional view of a preform which has been subjected to more than one cycle of symmetry inversion.

The above-described technique may be extended to provide a wide variety of azimuthal index distributions. For example, as shown in FIG. 6, by employing alternating pairs of heating and cooling jets, or by confining the heat source and rotating the jets, or the substrate, through only 90° between passes, the more complicated structure shown may be obtained. As can be seen, in this latter configuration the doped and undoped core layers, 43 and 53 respectively, alternate around the inner, core layer of the substrate. Obviously, by rotating the jets, or the substrate, through only 22½° one could achieve a structure having eight alternating doped and undoped core segments, and so on.

Figure 7:
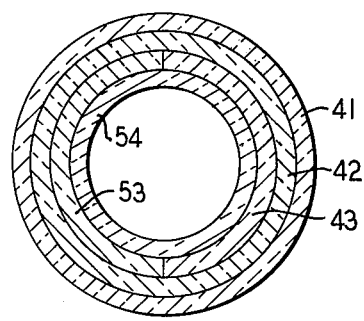
FIG. 7 is a cross-sectional view of the preform shown in FIG. 6 after an additional, undoped core layer has been formed thereon.

FIG. 7 depicts another embodiment of the invention wherein symmetrical heating is resumed to build-up another doped layer 54 over the alternating doped and undoped layers 43 and 53, respectively, which were built up during the asymmetrical heating portion of the process.

In the above discussed embodiments of the invention we have assumed the use of dopants such as germanium which increase the refractive index of the core layers 43 and 54. One skiilled in the art will appreciate, however, that it would also be possible to use dopants such as boron to decrease the index of selected core layers. Thus, according to this invention an optical fiber having layers of increased or decreased index at preselected radii and azimuthal angular extent can be produced by collapsing and then drawing the above-discussed preforms.

An article by J. Stone and C. A. Burrus entitled "Neodymium Doped Silica Layers in End Pumped Fiber Geometry" which appeared in *Applied Physics Letters*, Vol. 23, No. 7, 1 October 1973, at page 388, describes a modification of the waveguide-forming technique disclosed in U.S. Pat. No. 3,659,915 to R. D. Maurer and P. C. Schultz. As described by Stone and Burrus, a fiber was produced by coating the inside of a hollow quartz tube with a "spongy" frit of $SiO_2$, impregnating the frit with a solution of decomposable salts (chlorides or nitrates of the dopants, for example), oxidizing these salts at high temperature, and fusing and collapsing the hollow tube into a composite rod. One skilled in the art will appreciate that the previously described asymmetric heating process may be adapted for use with the preform making process described by Stone and Burrus.

Figure 8:
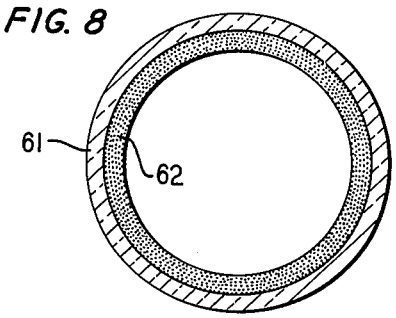
FIGS. 8 and 9 are cross-sectional views of a preform which is produced by a prior art liquid dopant process.
Figure 9:
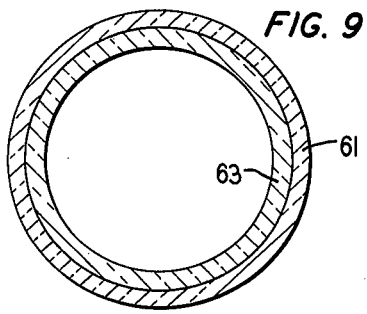
Figure 10:
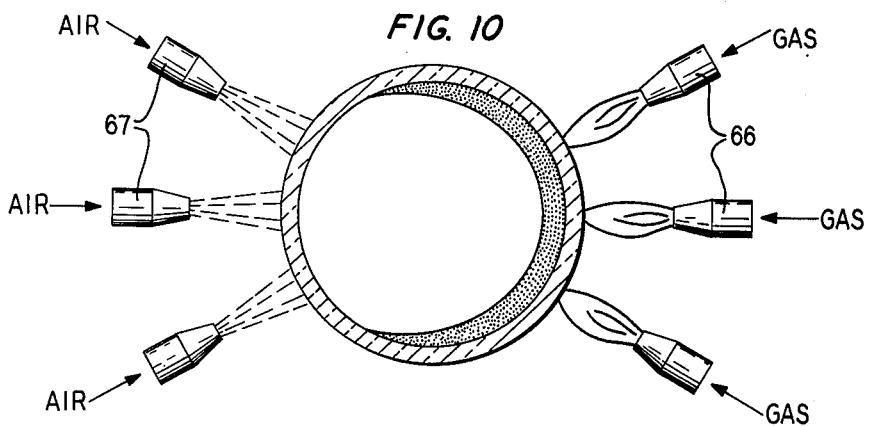
FIG. 10 is a partial cross-sectional view of another embodiment of the invention for asymmetrically heating the preform shown in FIGS. 8 and 9.
Figure 11:
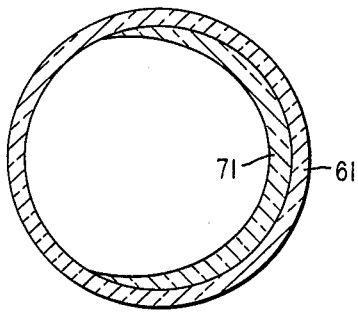
FIGS. 11 – 13 are cross-sectional views of the preform shown in FIG. 10 during various stages of the processing.

FIGS. 8 and 9 depict the prior art process as described by Stone and Burrus. As shown, a hollow, tubular $SiO_2$ substrate 61 is uniformly heated about its circumference to put down a circular symmetrical layer of $SiO_2$ frit 62 on the inside of the substrate at room temperature. Next, the $SiO_2$ frit is impregnated with a dopant suspended in a liquid, for example, aluminum or germanium in some suitable carrier. Then, at an elevated temperature the liquid is oxidized to leave aluminum oxide, for example, mixed with the $SiO_2$ frit. A still higher temperature then converts the $SiO_2$ - $Al_2O_3$ mixture 62 into an aluminum doped $SiO_2$ glass layer 63, as shown in FIG. 9. However, according to the invention, by the use of a plurality of heating jets 66 and cooling jets 67 asymmetric heating of substrate 61 produces a preferential layer of pure $SiO_2$ frit 68 on one side of substrate 61, as shown in FIG. 10. Then, at room temperature, this asymmetric layer of frit is impregnated with a liquid dopant. The dopant is then oxidized at an elevated temperature and, as shown in FIG. 11, the doped, asymmetric layer of frit 68 is converted into a layer of doped $SiO_2$ glass 71 which is, of course, also asymmetric.

Figure 12:
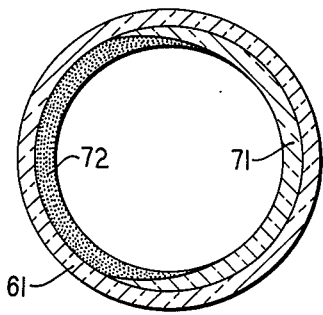
Figure 13:
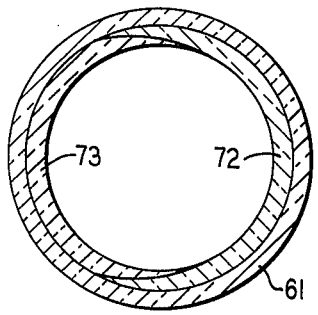

As shown in FIGS. 12 and 13, the asymmetrical heating is then reversed, or the substrate 61 rotated through 180°, and the process repeated to build-up another layer of pure SiO₂ frit 72, which frit is then converted into a layer of undoped glass 73.

This process can be repeated to build up successive layers of doped and undoped glass to establish a preform having the desired index distribution. Finally, collapsing and drawing the preform into a fiber yields a fiber having the desired eccentric index changes at selected radii and azimuthal extent.

One skilled in the art will appreciate that various changes and modifications can be made in the apparatus shown without departing from the spirit and scope of the invention.

What is claimed is:

1. In a method of manufacturing a preform which is intended to be subsequently drawn into an optical fiber, said method being of the type that includes the steps of:
    flowing a vapor mixture including at least one compound, glass-forming, precursor together with an oxidizing medium through a hollow, cylindrical substrate; and
    heating said substrate and contained vapor mixture with a moving heat source, external to the substrate, such that a suspension of particulate, oxidic reaction product material is produced within the substrate, said particulate material traveling downstream and coming to rest on the inner surface of said substrate and thereat being fused to form a continuous glassy deposit on said inner surface, the improvement which comprises:
    adding a dopant to said glass-forming precursor thereby to alter the refractive index of said particulate material;
    asymmetrically heating said substrate to preferentially deposit said doped particulate material as a continuous glassy deposit on at least one first region of said inner surface;
    removing the dopant from said glass-forming precursor;
    inverting the asymmetry of said asymmetrical heating to preferentially deposit said undoped particulate material as a continuous glassy deposit on at least one second region of said inner surface, said second region being substantially diametrically opposed from said first region; and then,
    terminating the process when said glassy deposit has attained a predetermined thickness.

2. The method according to claim 1 wherein said asymmetric heating step comprises:
    applying a source of heat to one side of said substrate.

3. The method according to claim 2 wherein said asymmetric heating step further comprises:
    applying a cooling source to the other side of said substrate.

4. The method according to claim 3 wherein said asymmetry inverting step comprises:
    interchanging said cooling and heating source.

5. The method according to claim 3 wherein said asymmetry inverting step comprises:
    rotating said substrate through an angle $\pi/n$ radians, $n \geq 1$.

6. The method according to claim 3 wherein said asymmetric heating step comprises:
    applying a plurality of heating and cooling sources to said substrate, said sources alternating about the circumference of said substrate.

7. In a method of manufacturing a preform which is intended to be subsequently drawn into an optical fiber, said method being of the type that includes the steps of:
    flowing a vapor mixture including at least one compound glass-forming, precursor together with an oxidizing medium through a hollow, cylindrical substrate;
    heating said substrate to deposit a layer of glassy frit on the inner surface of said substrate;
    terminating said vapor flowing and heating steps when said layer has obtained a predetermined thickness;
    flowing a liquid carrier through said substrate, said carrier having at least one dopant suspended therein thereby to impregnate said glassy frit with said dopant;
    reheating said substrate at a higher temperature to oxidize said dopant; and then
    increasing the temperature of said reheating step to convert the glassy frit-oxidized dopant mixture into a doped glass layer, the improvement which comprises:
    asymmetrically heating said substrate to preferentially deposit said layer of glassy frit on at least one first region of said inner surface; and then
    subsequent to said liquid carrier flowing step, inverting the asymmetry of said asymmetric heating to preferentially deposit a second layer of glassy frit on at least one second region of said inner surface whereby when said temperature is increased, the glassy-frit-oxidized dopant mixture layer on said at least one first region and the glassy-frit layer on said at least one second region are respectively converted into a unitary glass layer having respectively doped and undoped regions.

8. The method according to claim 7 wherein said asymmetric heating step comprises:
    applying a source of heat to one side of said substrate.

9. The method according to claim 7 wherein said asymmetric heating step further comprises:
    applying a cooling source to the other side of said substrate.

10. The method according to claim 9 wherein said asymmetry inverting step comprises:
    interchanging said cooling and heating source.

11. The method according to claim 9 wherein said asymmetry inverting step comprises:
    rotating said substrate through an angle $\pi/n$ radians, $n \geq 1$.

12. The method according to claim 9 wherein said asymmetric heating step comprises:
    applying a plurality of heating and cooling sources to said substrate, said sources alternating about the circumference of said substrate.

* * * * *

UNITED STATES PATENT AND TRADEMARK OFFICE
CERTIFICATE OF CORRECTION

PATENT NO. : 3,982,916
DATED : September 28, 1976
INVENTOR(S) : Stewart E. Miller It is certified that error appears in the above-identified patent and that said Letters Patent are hereby corrected as shown below:

Column 2, line 65, "14a" should read --14b--. Column 3, line 1, "exygen" should read --oxygen--. Column 6, line 17, "skiilled" should read --skilled--.

Signed and Sealed this

Twenty-fourth Day of May 1977

[SEAL]

Attest:

RUTH C. MASON
Attesting Officer

C. MARSHALL DANN
Commissioner of Patents and Trademarks